United States Patent
Pi et al.

(10) Patent No.: US 10,910,058 B2
(45) Date of Patent: Feb. 2, 2021

(54) SHARED SOURCE LINE MEMORY ARCHITECTURE FOR FLASH CELL BYTE-ALTERABLE HIGH ENDURANCE DATA MEMORY

(71) Applicant: Microchip Technology Incorporated, Chandler, AZ (US)

(72) Inventors: Jen-I Pi, Saratoga, CA (US); Kent Hewitt, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 0 days.

(21) Appl. No.: 16/539,766

(22) Filed: Aug. 13, 2019

(65) Prior Publication Data

US 2020/0058355 A1    Feb. 20, 2020

Related U.S. Application Data

(60) Provisional application No. 62/719,444, filed on Aug. 17, 2018.

(51) Int. Cl.
  *G11C 16/08*    (2006.01)
  *G11C 16/04*    (2006.01)
  (Continued)

(52) U.S. Cl.
  CPC .......... *G11C 16/0425* (2013.01); *G11C 16/08* (2013.01); *G11C 16/10* (2013.01); *G11C 16/14* (2013.01); *G11C 16/3427* (2013.01)

(58) Field of Classification Search
  CPC . G11C 16/0475; G11C 16/0483; G11C 16/14;
       G11C 16/0425; G11C 11/5671; G11C
       16/26; G11C 16/08; G11C 16/0408;
       G11C 16/0416; G11C 16/0433; G11C
       16/0466; G11C 16/10; G11C 16/0458
  (Continued)

(56) References Cited

U.S. PATENT DOCUMENTS

| 4,467,453 A | 8/1984 | Chiu et al. ............... 365/185.16 |
| 4,949,309 A | 8/1990 | Rao .......................... 365/185.12 |

(Continued)

OTHER PUBLICATIONS

International Search Report and Written Opinion, Application No. PCT/US2019/046739, 18 pages, dated Oct. 23, 2019.

*Primary Examiner* — Thong Q Le
(74) *Attorney, Agent, or Firm* — Slayden Grubert Beard PLLC

(57) ABSTRACT

A memory array includes (a) multiple memory cells arranged into a plurality of bytes, (b) a separate word line connected to each byte, and (b) multiple shared source lines, each connected to at least two bytes, such that each byte in the array is addressable by a separate word line and by the shared source line. Due to this memory array architecture, a program operation on a first byte applies a shared source line voltage on a non-selected second byte (with an inhibit voltage applied to bit lines connected to the second byte), which creates a disturb condition that corresponds with a diagonal (or row) program disturb condition in a conventional memory array. The use of the shared source lines may reduce the required number of source line drivers, which reduces the overhead area of the memory array, and at same time, allow backward compatibility of traditional byte-alterable EEPROM.

20 Claims, 14 Drawing Sheets

(51) Int. Cl.
*G11C 16/10* (2006.01)
*G11C 16/14* (2006.01)
*G11C 16/34* (2006.01)

(58) Field of Classification Search
USPC ............ 365/185.17, 185.03, 185.14, 185.28,
365/185.29, 204, 185.18, 185.05, 185.22,
365/185.25, 185.33; 257/E27.103,
257/E21.679, E29.308, 324, 314, 316,
257/E21.21, E21.69, E29.309, 213, 288,
257/315, 326, 208, 209
See application file for complete search history.

(56) References Cited

U.S. PATENT DOCUMENTS

| | | | |
|---|---|---|---|
| 5,029,130 A | 7/1991 | Yeh | 365/185.31 |
| 5,612,913 A | 3/1997 | Cappelletti et al. | 365/185.12 |
| 5,812,452 A | 9/1998 | Hoang | 365/185.11 |
| 6,300,183 B1 | 10/2001 | Gerber et al. | 438/228 |
| 6,326,661 B1 | 12/2001 | Dormans et al. | 257/315 |
| 6,504,191 B2 | 1/2003 | Gerber et al. | 257/286 |
| 6,747,310 B2 | 6/2004 | Fan et al. | 257/320 |
| 7,006,381 B2 | 2/2006 | Dormans et al. | 365/185.28 |
| 7,057,228 B2 | 6/2006 | Chih et al. | 257/314 |
| 7,072,215 B2 | 7/2006 | Chih | 365/185.14 |
| 7,072,512 B2 | 7/2006 | Mehrotra | 382/173 |
| 7,154,783 B2 | 12/2006 | Lee et al. | 365/185.11 |
| 7,349,257 B2 | 3/2008 | Lee et al. | 365/185.12 |
| 7,804,713 B2 | 9/2010 | Parker | 365/185.03 |
| 8,711,363 B2 | 4/2014 | Kilic et al. | 356/460 |
| 9,972,392 B2 | 5/2018 | Hsu | |
| 2004/0027856 A1 | 2/2004 | Lee et al. | 365/185.11 |
| 2007/0091682 A1 | 4/2007 | Kang et al. | 365/185.17 |
| 2016/0042790 A1* | 2/2016 | Tran | G11C 16/26 365/185.29 |
| 2016/0307637 A1 | 10/2016 | Hsu | 365/185.02 |

* cited by examiner

SHARED SOURCE LINE MEMORY ARCHITECTURE FOR FLASH CELL BYTE-ALTERABLE HIGH ENDURANCE DATA MEMORY

RELATED APPLICATION

This application claims priority to U.S. Provisional Patent Application No. 62/719,444 filed Aug. 17, 2018, the contents of which are hereby presented in their entirety.

TECHNICAL FIELD

The present disclosure relates to integrated circuit memory devices, and more particularly to a memory device including a memory array that utilizes a shared source line (SL) architecture for byte-alterable flash memory to provide high endurance and/or reduced area on the die or chip.

BACKGROUND

Common memory devices, such as electrically-erasable, programmable read-only memory (EEPROM) flash memory devices, utilize a byte-selectable memory array.

FIG. 1 shows an example of a conventional byte-selectable memory array that uses a single (byte) select transistor (circled) to select a particular byte (indicated by the dashed line) of a memory cell array, e.g., to program or erase the selected byte.

FIG. 2 shows an example conventional memory array architecture in which bytes are separated using separate implant wells, e.g., as employed in certain PMOS Electrically Erasable Cell (PEEC) and NMOS Electrically Erasable Cell (NEEC) designs by Microchip Technology Inc. having a headquarters in Chandler, Ariz. As shown, each horizontal word line may extend across multiple bytes, which bytes are separated from each other using separate wells. However, this well separation architecture typically requires a large area on the respective chip or die.

FIG. 3 shows an example of a conventional single-gate memory cell design, which is embodied in certain embedded SuperFlash® (ESF) memory cell designs available from Microchip Technology Inc. The logic state of the cell is determined by the electron charge in the floating gate (FG), either positive charged or negative charged. In particular, an erase operation extracts electrons from the floating gate to the word line, to create a positive charge in the floating gate, while a program operation injects electrons from the bit line into the floating gate via a channel current created in the doped channel under the word line and make FG negative charged.

FIG. 4 shows three cross-section views of an example SuperFlash® ESF memory cell according to the design shown in FIG. 3, along with an operational voltage table, to illustrate read, erase, and program terminal conditions for the example memory cell.

FIG. 5 shows similar details for an example dual-floating gate SuperFlash® ESF memory cell, which also incorporates the design shown in FIG. 3, but with a pair of floating gates. In particular, FIG. 5 shows (a) a cross-section SEM view of the example dual-floating gate memory cell, (b) an overhead layout view of the cell, (c) a circuit schematic of the cell, and (d) an example operational voltage table for the cell.

As known in the art, the selection of particular cells in a memory array, e.g., for programming or erasing such cells, typically applies at least one voltage to neighboring cells in the array, which may cause unwanted "disturb" effects in the neighboring cells that may affect the endurance lifetime of such cells. Disturb effects caused by a program operation are referred to as "program disturb" effects, while disturb effects caused by an erase operation are referred to as "erase disturb" effects. Program disturb effects are typically more substantial and thus more problematic.

FIG. 6 shows example program disturb effects caused by a program operation in a conventional memory array, where the word line (WL) and the select line (SL) are shared across multiple bytes in an array. In particular, FIG. 6 is a schematic of a portion of a conventional memory array, showing a particular bit cell (memory cell) that is currently selected for a program operation, and three types of non-selected bit cells (cells a, b, and c) that may experience program disturb effects caused by the program operation on the selected bit cell. In this example, the selected bit cell is selected by applying a high program voltage Vpp to the source line SL, applying Vcc to word line $WL_1$, and applying a 0.7V to the bit line while non-selected cells on the same row need to have a high voltage (Vinh) applied to the respective bit lines to inhibit the program operation to such cells.

The disturb effects experienced by non-selected bits cells typically depend on the relationship between the respective non-selected cell and the selected cell, e.g., the cell being programmed (or erased). With reference to FIG. 6, non-selected cells in the same column but different row as the selected cell, e.g., the cell indicated at "A," experience a "column disturb" condition. Non-selected bit cells in the same row but different column as the selected cell, each indicated at "B," experience a "row disturb" condition. As shown, an inhibit voltage, Vinh, is applied to the bit line of the un-selected column to reduce the row disturb effects. Finally, non-selected cells not in the same row or column of the selected cell, each indicated at "C," experience a "diagonal disturb" condition. Diagonal disturb effects are typically less significant, and thus less problematic, than row disturb and/or column disturb effects. For example, memory cells in certain conventional arrays show no significant current degradation after being subjected to diagonal disturb conditions for at least 100 k cycles at 125 C.

FIG. 7 shows memory cell cross-sections and a Disturb Stress Table, which together illustrate typical program disturb stress conditions in a conventional flash memory array, including row disturb, column disturb, and diagonal disturb stress conditions. The memory cell cross-sectional views show example voltages applied on the respective word line, source line, and bit line of an un-selected memory cell during a program operation on a neighboring selected cell, for (a) an unselected memory cell arranged in the same row as the cell being programmed, (b) an unselected memory cell arranged in the same column as the cell being programmed, and (c) an unselected memory cell arranged in a diagonal relationship with the cell being programmed (e.g., in an adjacent row and adjacent column as the programmed cell). The Disturb Stress Table shows example voltages applied to the cell being programmed and to the three categories of unselected cells shown in the three cross-sectional views. As noted above, diagonal disturb conditions typically have little effect on long-term cell endurance, for example showing little degradation after over 100 k cycles in a diagonal disturb condition.

FIG. 8 shows an example layout of a portion of a byte-alterable flash memory array 100 using split-gate memory cells. In this example, each byte is connected to a separate word line and a separate source line from each other byte, which is referred to as a "fully decoded" array. The example flash memory array 100 is organized into bytes 102, in which each byte includes 8 logical bits 104, with each logical bit 104 including a pair of physical bit cells 106, such that each byte 102 includes 16 bit cells. The illustrated area of array 100 includes two bytes indicated at 102A and 102B. The 16 bits in each byte 102A, 102B are connected by a respective source line (active) strap 110 and a pair of word line (poly 2) straps 112 extending across the 16 bits, with the pair of word line straps 112 being connected to each other by a vertically-extending strap formed in a higher layer (not shown).

As shown in FIG. 8, the source line strap 110 of byte 102A is unconnected from the source line strap 110 of byte 102B. Similarly, the two word line straps 112 of byte 102A are unconnected from the two word line straps 112 of byte 102B. Thus, array 100 defines a byte-alterable architecture in which byte select is provided by physical separation of the both the source lines and word lines between adjacent bytes 102 in the direction of the source and word lines (in this example, in the horizontal direction). Thus, each byte 102 in the array is independently addressable by a word line (in particular, a pair of connected word line straps 112 as shown in FIG. 8), a source line (in particular, a word line strap 110), and 8 bit lines, each bit line connected to a single logical bit 104 (consisting of a pair of physical bit cells 106, as shown in FIG. 8) of the respective byte 102.

FIG. 9 shows an example schematic of the fully decoded byte-alterable flash memory array 100 shown in FIG. 8. Array 100 is fully decoded in the sense that each byte 102 is independently addressable by a word line (for byte erase) and source line (for byte program) that are separate from the word line and source line of each other byte 102. In addition, the bytes in each column are connected to 8 shared bit lines, such that each logical bit in each byte can be addressed independently. Because each byte is fully decoded during erase and program operations, they are disturb immune during such operations.

Fully decoded memory arrays typically require a large area on a die/chip. For example, a conventional fully decoded 1 k byte memory array includes 1 k source drivers and 1 k word line drivers. Each source driver is typically large as it needs to provide programming current for the respective flash memory cell with little voltage drop.

There is a need for an improved embedded data flash memory array having the following characteristics: (a) byte/word alterable, (b) high endurance (e.g., immune or resistant to program disturb), (c) compatible with SuperFlash® ESF (Embedded SuperFlash®) NOR flash memory or other split-gate flash memory cell architecture and operation, and/or (d) requiring reduced area on the die/chip.

SUMMARY

Embodiments of the present invention provide an improved memory array. Some embodiments provide a byte-alterable flash memory architecture that utilizes a shared source line (SL) architecture that provides high endurance (e.g., program disturb similar to diagonal disturb in a conventional memory array) and/or has a reduced overhead area on the chip/die. In some embodiments the memory array comprises NOR flash memory, e.g., SuperFlash® ESF (Embedded SuperFlash®) memory, or other split-gate flash memory cells.

As used herein, a "byte" may include any number of bits, for example, 1, 2, 3, 4, 5, 6, 7, 8, or more bits.

One embodiment provides a memory array including (a) a plurality of memory cells arranged into a plurality of bytes, (b) a plurality of separate word lines, each connected to one byte of the plurality of bytes, and (c) a shared source line connected to the plurality of bytes, such that each byte in the plurality of bytes is addressable by one of the separate word lines and by the shared source line. Each byte may include a plurality of memory cells, and the memory array may include a plurality of bit lines connected to each byte, wherein the plurality of bit lines connected to each respective byte are connected to the plurality of memory cells in the respective byte.

In one embodiment, the plurality of bytes is a subset a bytes in the memory array.

In one embodiment, the plurality of bytes includes 2, 4, 8, 16, 32, 64, or 128 bytes.

In one embodiment, the plurality of bytes includes at least a first byte and a second byte connected to the common source line, and a program operation on the first byte applies a source line voltage on the second byte that corresponds with a diagonal program disturb condition.

In one embodiment, the plurality of bytes includes at least a first byte and a second byte; the first byte is connected to a first word line of the plurality of word lines; the second byte is connected to a second word line of the plurality of word lines; the first and second bytes are connected to the common source line; the first byte is connected to at least one first bit line; and the second byte is connected to at least one second bit line separate from the at least one first bit line.

In one embodiment, the memory array includes drivers configured to, for a program operation on the first byte: apply a first word line voltage on the first word line connected to the first byte, apply a source line voltage on the shared source line connected to both the first and second bytes, and apply an inhibit voltage on the at least one second bit line connected to the second byte.

In some embodiments, the plurality of memory cells comprise NOR flash memory cells. In some embodiments, the plurality of memory cells comprise a plurality of split-gate memory cells. In some embodiments, the plurality of split-gate memory cells comprise split-gate cells having a shared erase gate. In some embodiments, the plurality of split-gate memory cells comprise split-gate memory cells having a shared coupling gate. In some embodiment, the plurality of split-gate memory cells comprise embedded SuperFlash® memory cells.

In one embodiment, the memory array includes a single source line driver for the shared source line, such that a total number of single source line drivers in the memory array is less than a total number of bytes in the memory array.

Another embodiment provides a memory device including an memory array comprising a plurality of memory cells arranged into a plurality of bytes; a plurality of separate word lines, each word line connected to one byte of the plurality of bytes; a plurality of shared source lines, each shared source line connected to at least two of the plurality of bytes; a plurality of word line drivers configured to apply voltages to the plurality of separate word lines; and a plurality of source line drivers configured to apply voltages to the plurality of shared source lines. Each byte in the plurality of bytes is addressable by (a) one of the separate word lines connected to a respective source word line driver and (b) one of the shared source lines connected to a respective source line driver. As a result of each shared source line being connected to at least two bytes, the number of shared source lines in the memory device is less than the number of word lines in the memory device, and the number of source line drivers in the memory device is less than the number of word drivers in the memory device.

In one embodiment, each shared source line is connected to 2, 4, 8, 16, 32, 64, or 128 bytes. In one embodiment, the plurality of memory cells comprise NOR flash memory cells. In one embodiment, the plurality of memory cells comprise split-gate memory cells. In one embodiment, the plurality of memory cells comprise embedded SuperFlash® memory cells.

Another embodiment provides a method of operating a memory array including at least a first byte and a second byte, a first word line and at least one first bit line connected to the first byte, a separate second word line and at least one second bit line connected to the second byte, and a shared source line connected to both the first and second bytes. The includes performing a program operation on the first byte by: applying a first word line voltage on the first word line connected to the first byte, applying respective data voltages on the at least one first bit line connected to the first byte, and applying a source line voltage on the shared source line connected to both the first and second bytes.

In one embodiment, the method also includes, during the program operation on the first byte, applying an inhibit voltage on the at least one second bit line connected to the second byte, wherein the inhibit voltage reduces disturb effects on the second byte caused by the program operation on the first byte.

BRIEF DESCRIPTION OF THE FIGURES

Example aspects and embodiments of the present disclosure are described below in conjunction with the following appended drawings.

DETAILED DESCRIPTION

Embodiments of the present disclosure provide a byte-alterable flash memory array architecture that may utilize a shared source line (SL) architecture for improved memory cell endurance and/or reduced die area requirements of the memory array.

Some embodiments of the present invention may utilize shared source lines, wherein each shared source line is shared by multiple bytes in the memory array. Each shared source line may be shared by any suitable number of bytes in the memory array. The use of the shared source lines may reduce the number of required source line drivers, and thus reduce the total overhead area of the array on the chip, while still providing reduced disturb effects as compared with conventional memory array designs.

In some embodiments, a memory array may include (a) a plurality of memory cells arranged into a plurality of bytes, (b) a separate word line connected to each byte, and (b) a plurality of shared source lines, each connected to at least two bytes, such that each byte in the array is addressable by a separate word line and by the shared source line. Each byte may include a plurality of memory cells, and the memory array may include a plurality of bit lines connected to each byte, wherein the plurality of bit lines connected to each respective byte are respectively connected to the plurality of memory cells in the respective byte. Due to the architecture of such memory array, a program operation on a first byte applies a shared source line voltage on a non-selected second byte (and an inhibit voltage may be applied to bit lines connected to the second byte), which creates a disturb condition that corresponds with a diagonal program disturb condition in a conventional memory array. Each shared source line may be connected to any suitable number of bytes, e.g., 2, 4, 8, 16, 32, 64, or 128 bytes. The memory cells in the array may comprise NOR flash memory cells, e.g., embedded SuperFlash® (ESF) memory cells, or other split-gate memory cells.

Figure 10A:
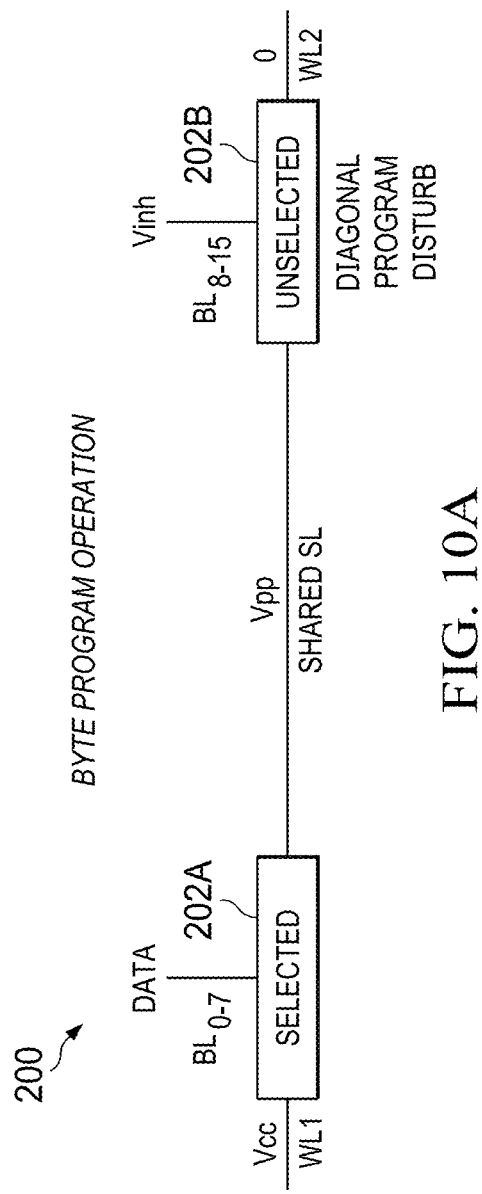
FIGS. 10A and 10B show a schematic of two neighboring bytes in a byte-alterable split-gate flash memory array that uses shared source lines, according to an example embodiment in which an unselected memory cell is subjected to a diagonal disturb condition (FIG. 10A) and an example embodiment in which the unselected memory cell is subjected to a row disturb condition (FIG. 10B)
Figure 10B:
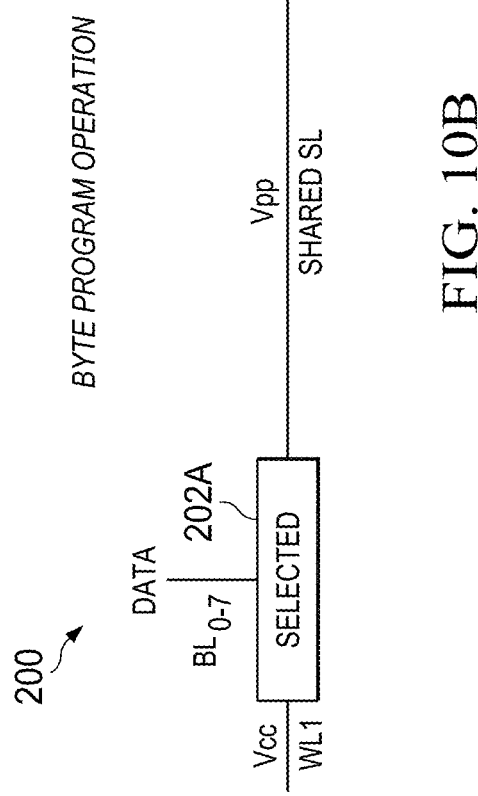

FIGS. 10A and 10B are schematics of a portion of an example byte-alterable split-gate flash memory array that utilizes shared source lines connected to multiple bytes, according to an example implementation in which an unselected memory cell is subjected to a diagonal disturb condition (FIG. 10A) and an example implementation in which the unselected memory cell is subjected to a row disturb condition (FIG. 10B). More particularly, FIGS. 10A and 10B show a schematic of two neighboring bytes 202A and 202B in a byte-alterable split-gate flash memory array 200 that is similar to memory array 100 discussed above, but uses a shared source line connected to bytes 202A and 202B (the shared source line may be connected to any number of bytes in the array 200, depending on the particular array design).

Figure 6:
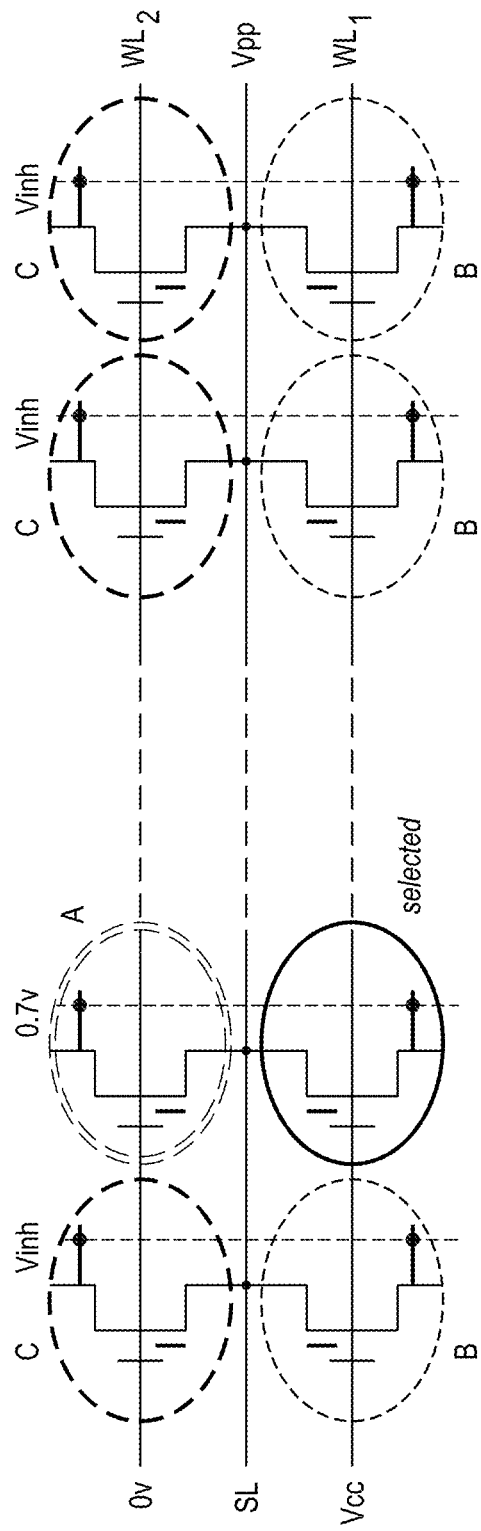
FIG. 6 shows example program disturb effects, including column disturb effects, row disturb effects, and diagonal disturb effects, caused by a program operation in a conventional memory array.
Figure 7:
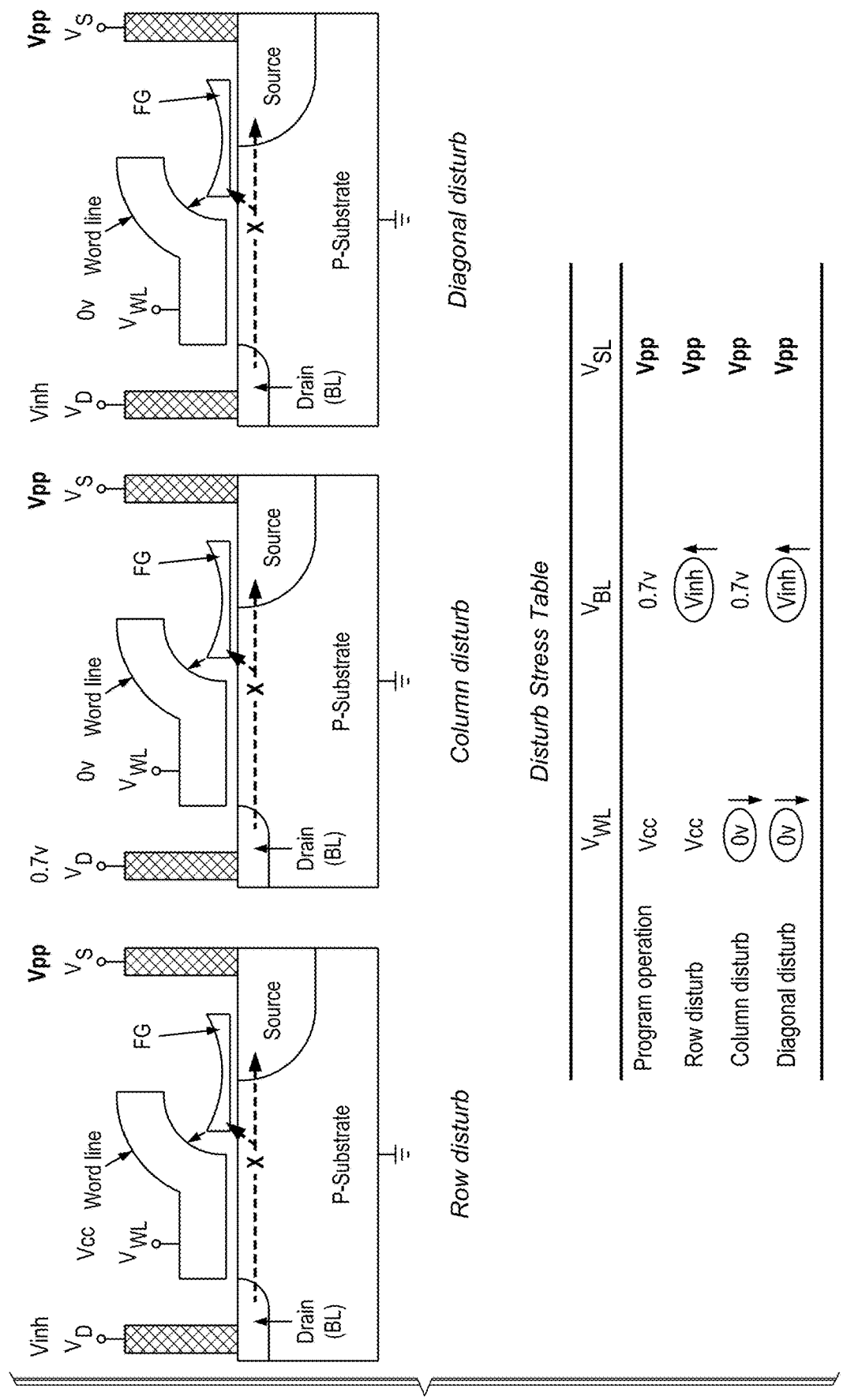
FIG. 7 shows memory cell cross-sections and a disturb stress table that illustrate typical program disturb stress conditions in a conventional flash memory array, including row disturb, column disturb, and diagonal disturb stress conditions.
Figure 8:
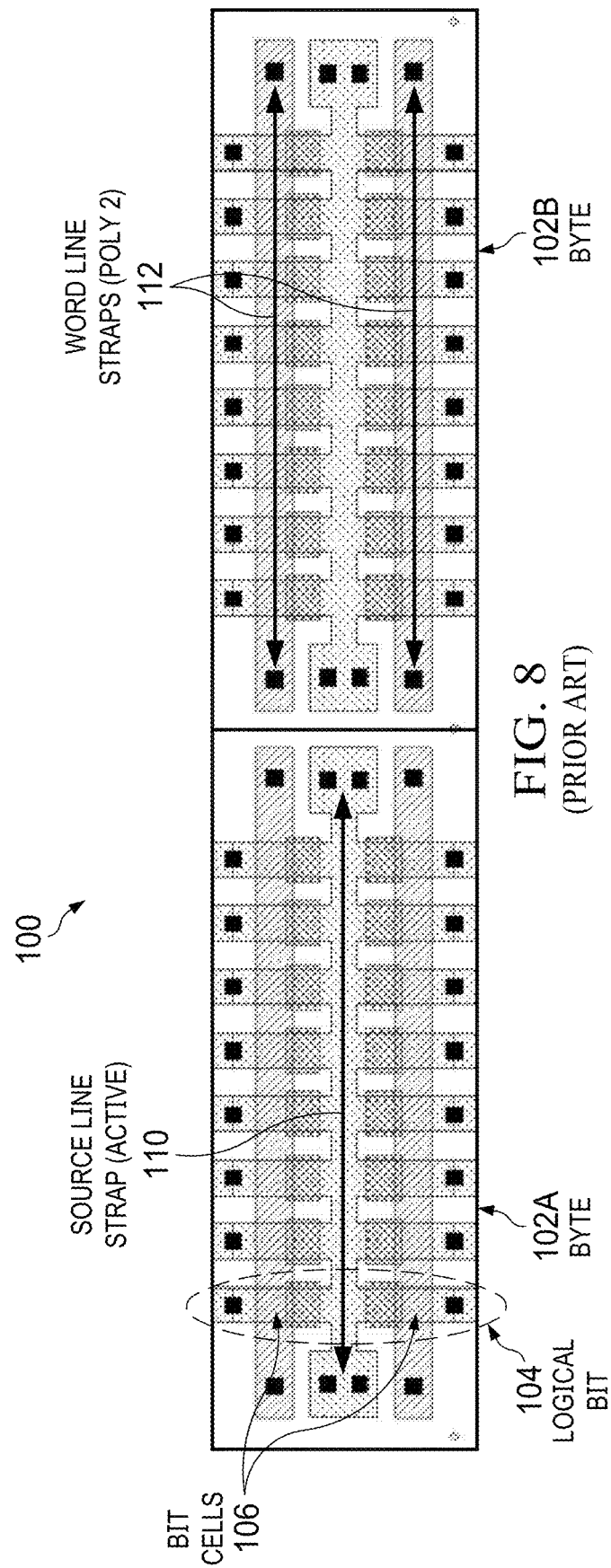
FIG. 8 shows an example layout of a portion of a conventional byte-alterable flash memory array using split-gate memory cells.
Figure 9:
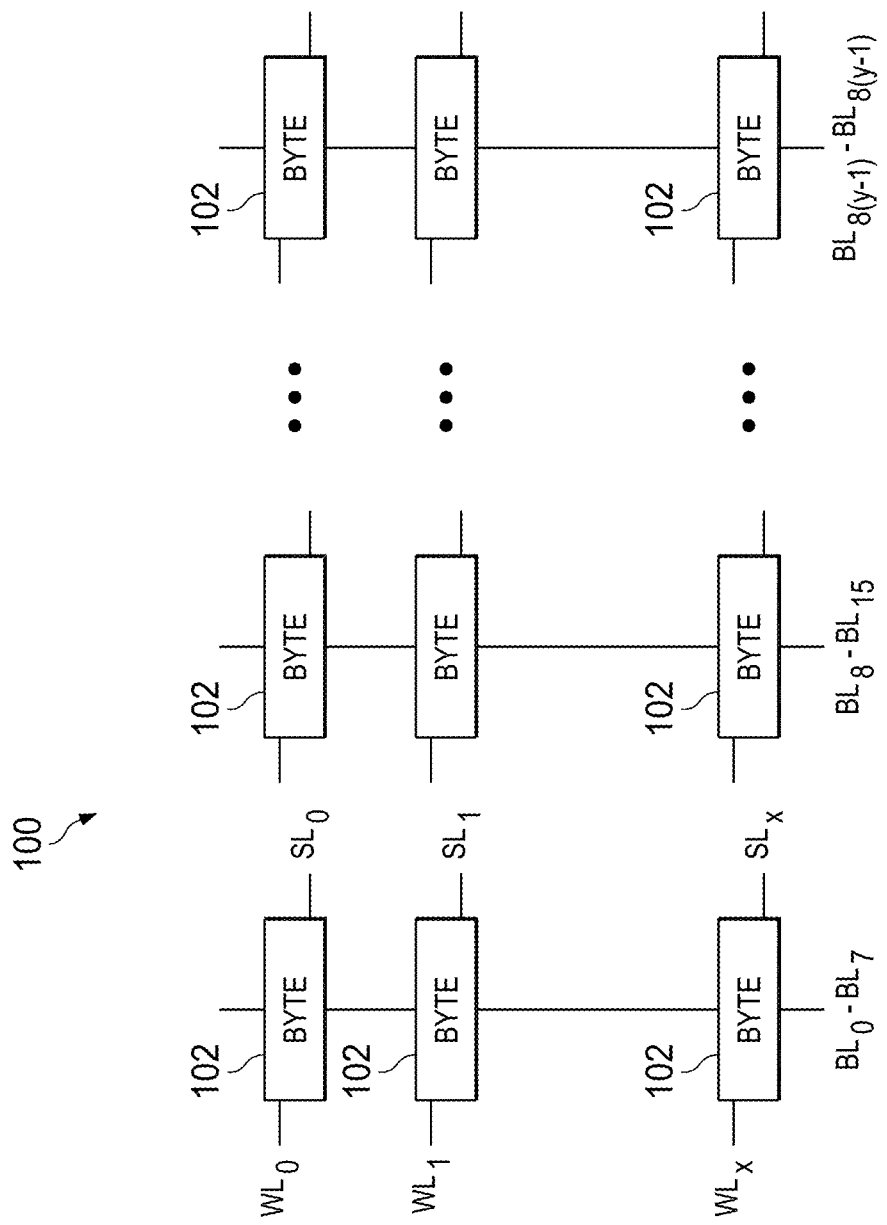
FIG. 9 shows an example schematic of the fully decoded byte-alterable flash memory array shown in FIG. 8.

In the example implementation shown in FIG. 10A, a byte program operation is being performed on byte 202A, by applying the respective voltages Vcc, Vpp, and "data" to $WL_1$, shared source line SL, and $BL_{0-7}$, respectively. As shown, Vpp is also applied to the unselected neighboring byte 202B via the shared source line, an inhibit voltage Vinh is applied to the bit lines $BL_{8-15}$ of byte 202B, and 0V may be applied to $WL_2$ of byte 202B. As a result of the shared source line configuration and the example bias conditions shown in FIG. 10A, the unselected byte 202B is subject to voltages that correspond to a diagonal program disturb condition (see, e.g., FIGS. 6 and 7 discussed below), known to be the least problematic disturb condition.

In the example implementation shown in FIG. 10B, a byte program operation with the same bias conditions as the example implementation of FIG. 10A, but with a non-zero voltage Vcc applied to $WL_2$ of byte 202B, rather than 0V as in the implementation of FIG. 10A. As a result of the shared source line configuration and the example bias conditions shown in FIG. 10B, the unselected byte 202B is subject to voltages that correspond to a row program disturb condition (see, e.g., FIGS. 6 and 7 discussed below), similar to a diagonal disturb condition and thus relatively unproblematic.

Figure 11:
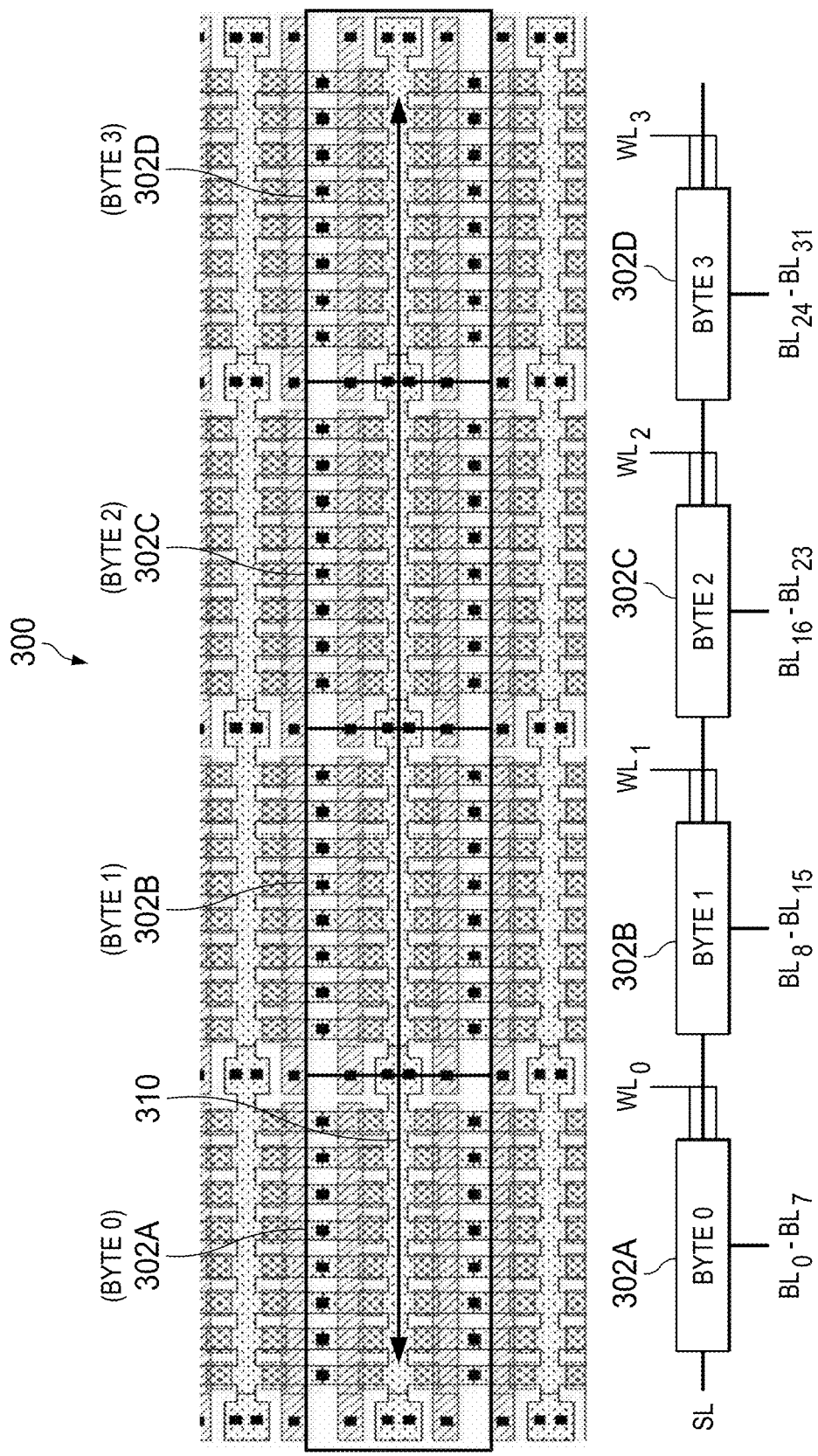
FIG. 11 shows an example layout and schematic for a byte-alterable memory array using split-gate memory cells and using shared source lines, according to an example embodiment of the present invention.

FIG. 11 shows an example layout (top) and schematic (bottom) for a byte alterable array 300 using split-gate memory cells and using shared source lines, according to an example embodiment of the present invention. In this example, a common source line 310 is shared across each row of four bytes 302A-302D.

Figure 12A:
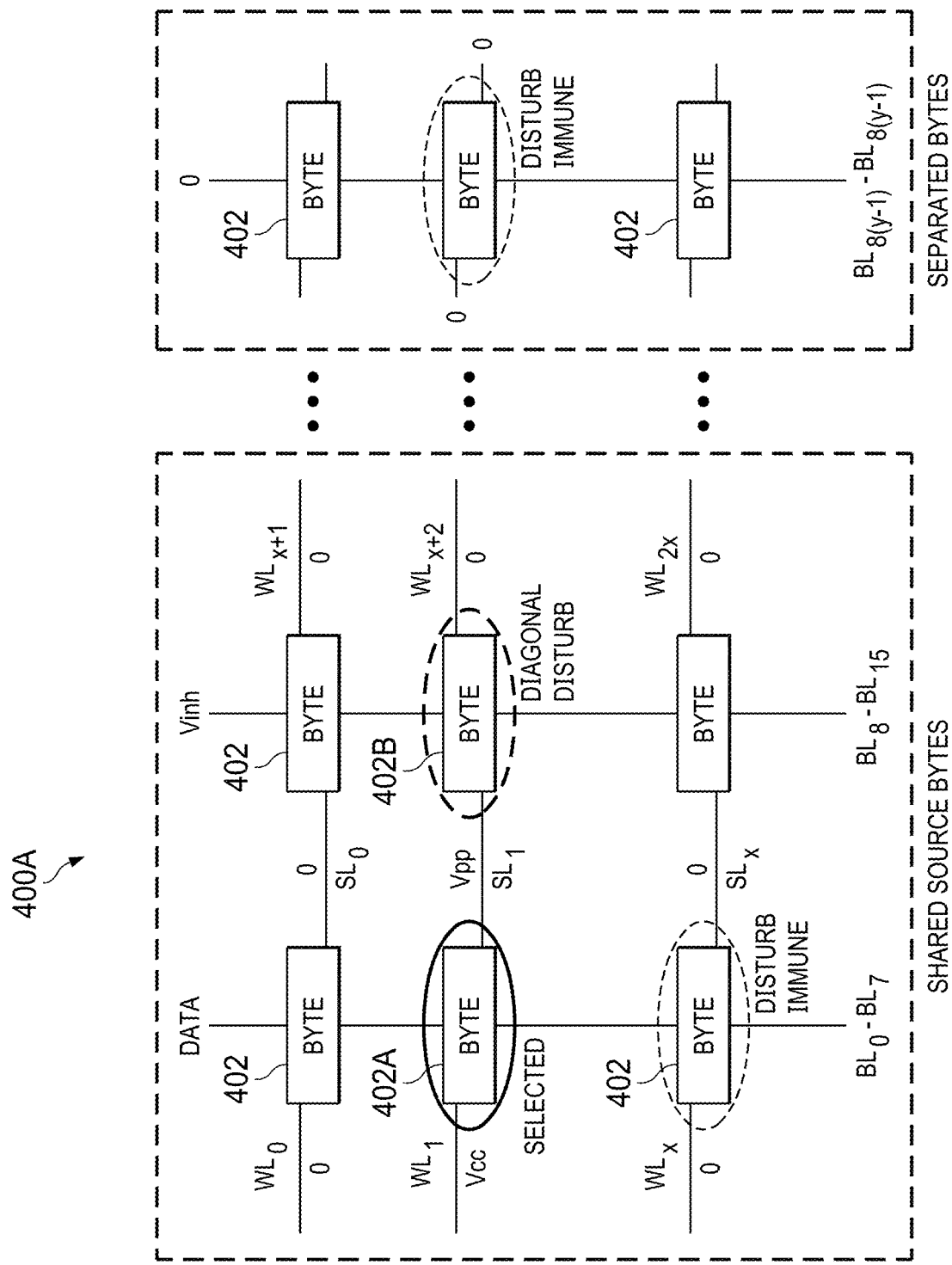
FIGS. 12A and 12B show a schematic of an example shared source line memory array, according to an example embodiment in which an unselected memory cell is subjected to a diagonal disturb condition (FIG. 12A) and an example embodiment in which the unselected memory cell is subjected to a row disturb condition (FIG. 12B)
Figure 12B:
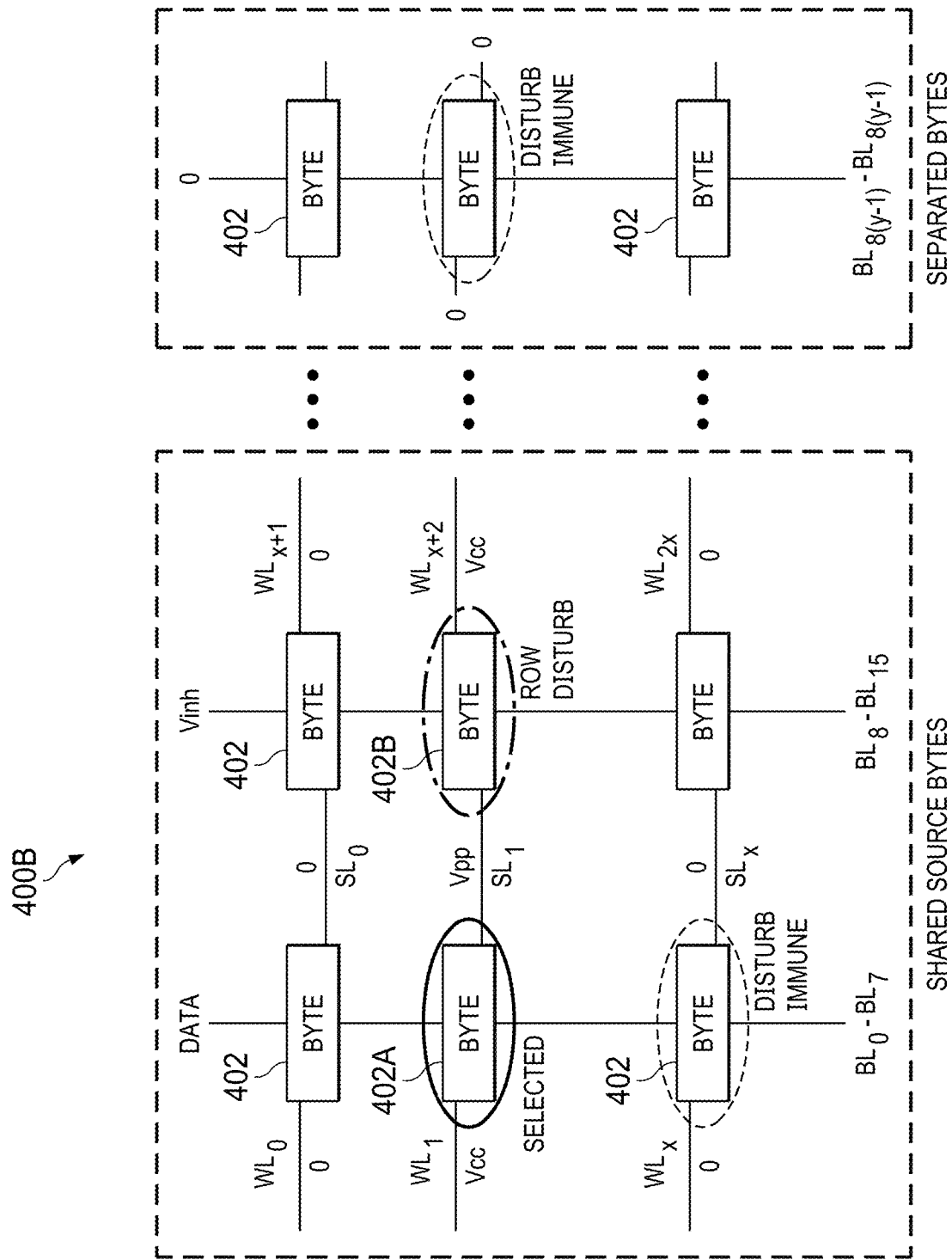

FIGS. 12A and 12B are schematics of an example shared source line memory array 400, according to an example implementation in which an unselected memory cell is subjected to a diagonal disturb condition (FIG. 10A) and an example implementation in which the unselected memory cell is subjected to a row disturb condition (FIG. 10B). Array 400 shown in FIGS. 12A and 12B may corresponding with the partial array shown in FIGS. 10A and 10B.

As shown in FIGS. 12A and 12B, each row of bytes 402 is connected to a shared source line SL. In the example implementation shown in FIG. 12A, a byte program operation is being performed on byte 402A, by applying the respective voltages Vcc, Vpp, and "data" to $WL_1$, shared source line $SL_1$, and $BL_{0-7}$, respectively. As shown, Vpp is also applied to the unselected neighboring byte 402B via the shared source line $SL_1$, an inhibit voltage Vinh is applied to the bit lines $BL_{8-15}$ of byte 402B, and 0V may be applied to $WL_{x+2}$ of byte 402B. As a result of the shared source line configuration and the example bias conditions shown in FIG. 12A, the unselected byte 402B is subject to voltages that correspond to a diagonal program disturb condition (see, e.g., FIGS. 6 and 7 discussed below), known to be the least problematic disturb condition.

In the example implementation shown in FIG. 12B, a byte program operation with the same bias conditions as the example implementation of FIG. 12A, but with a non-zero voltage Vcc applied to $WL_{x+2}$ of unselected byte 402B, rather than 0V as in the implementation of FIG. 12A. As a result of the shared source line configuration and the example bias conditions shown in FIG. 12B, the unselected byte 402B is subject to voltages that correspond to a row program disturb condition (see, e.g., FIGS. 6 and 7 discussed below), similar to a diagonal disturb condition and thus relatively unproblematic.

Embodiments of the present invention may provide various advantages over conventional memory arrays. For example, connecting multiple bytes (e.g., 2, 4, 8, . . . etc. bytes) to a shared source line reduces the number of source line drivers in the array, while subjecting un-selected bytes during a program operation to a disturb condition corresponding (at worst) to a diagonal disturb condition in a conventional memory array. The equivalent diagonal disturb condition provided by the present shared source line architecture allows for high endurance (lifespan) of the memory array. Thus, for example, performing program operations on a selected byte would cause insignificant disturb effects on non-selected bytes on the same shared source line as the selected byte, and cause no significant degradation of the non-selected bytes, even after at least 100 k program cycles on the selected byte.

Embodiments of the present invention may allow a reduction in the number of source line drivers, e.g., as a ratio/percentage of the number of bytes in the array, and thus a reduction in the required footprint for the source line divers, and reduction in the overall size of the chip/die.

Figure 13:
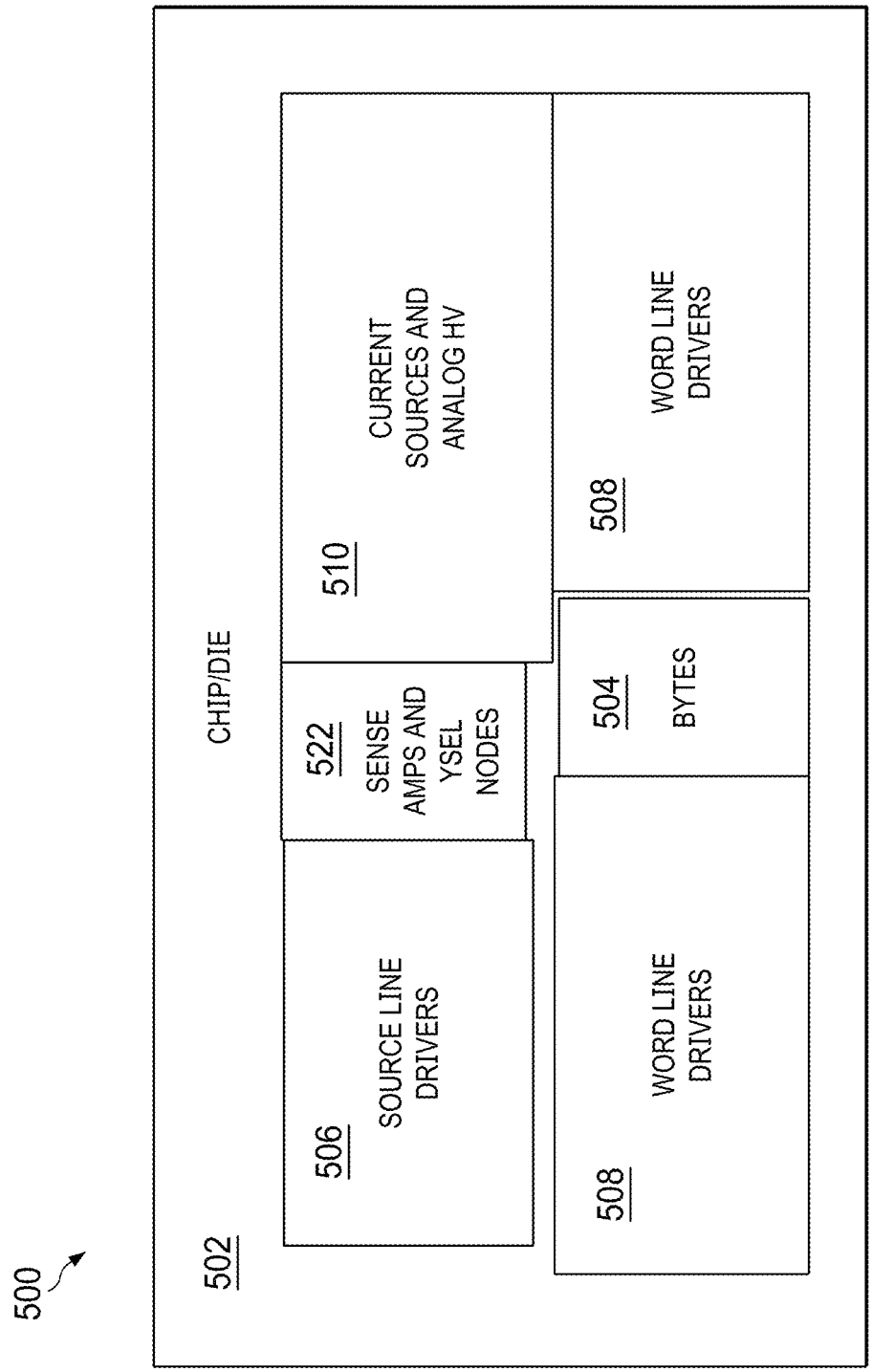
FIG. 13 is schematic of an example memory device incorporating at least one shared source line memory array, according to an example embodiment of the present invention.

FIG. 13 is schematic of an example memory device 500, according to an example embodiment of the present invention. Memory device 500 may include one or more memory chips (or dies) 502. Each memory chip 502 may include an array of memory bytes 504, source line drivers 506, word line drivers 508, current sources and analog HV sources 510, sense amplifiers and Ysel nodes 522, and any other suitable circuitry components. As discussed above, each byte in the memory array 504 may be connected to a separate word line (with each word line connected to a respective word line driver) and to a shared source line (with each shared source line connected to a respective source line driver). Each shared source line may be connected to any suitable number of bytes, e.g., 2, 4, 8, 16, 32, 64, or 128 bytes.

As a result of using shared source lines, for example using one shared source line for each N byte, the number of sources line drivers (and thus the required footprint on the chip for the source line drivers) may be reduced by a factor of N, as compared with conventional chip layouts. For example, if chip 502 includes 1,024 bytes and each group of 4 bytes is connected to a shared source line, the chip may include 1,024 word line drivers but only 256 source line drivers (1,024 divided by 4), which may thus reduce the required source driver footprint by a factor of four or about four.

Figure 1:
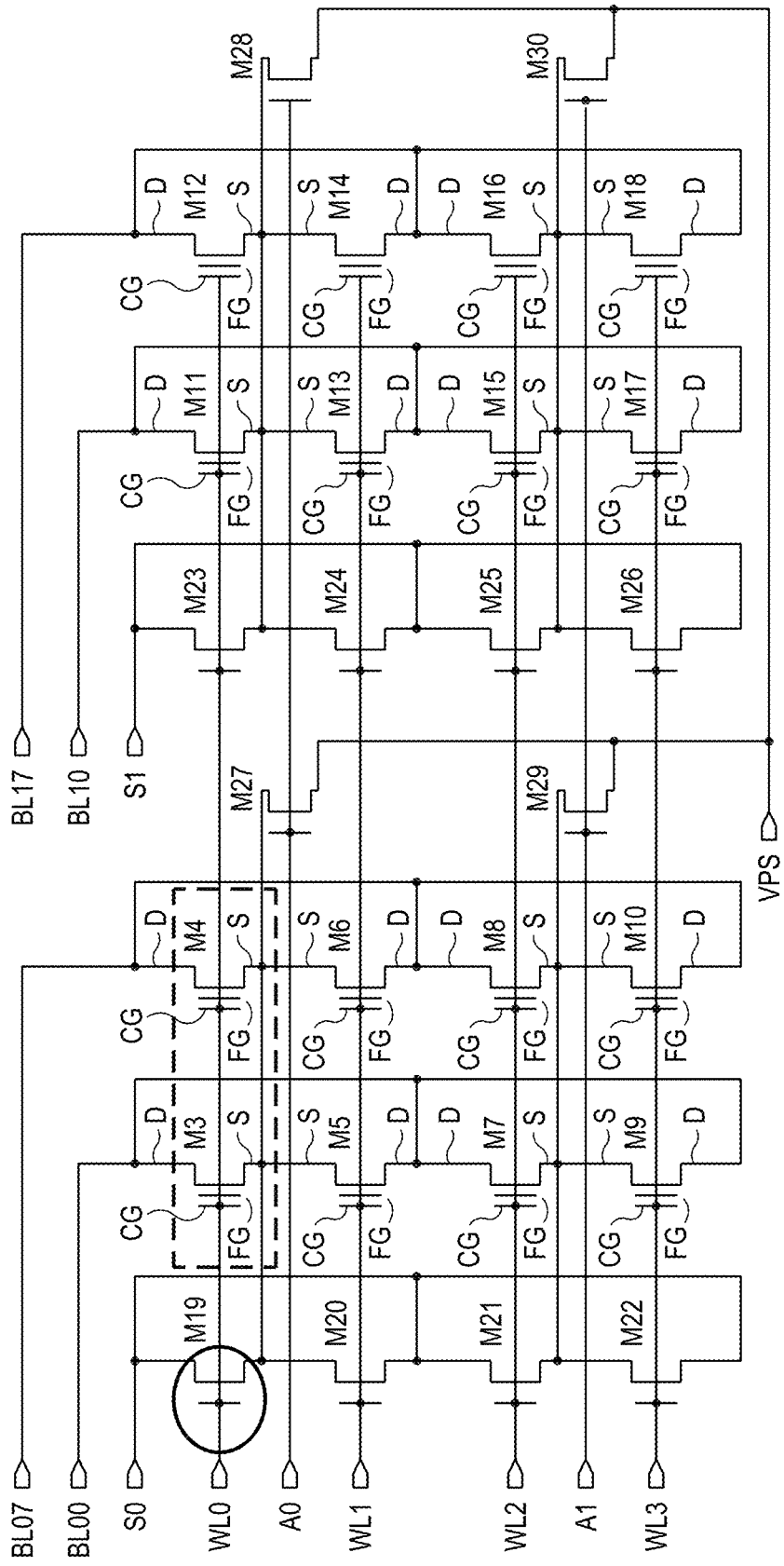
FIG. 1 shows an example of a conventional byte-selectable memory array that uses a single byte select transistor to select a particular byte of a memory cell array, e.g., to program or erase the selected byte.
Figure 2:
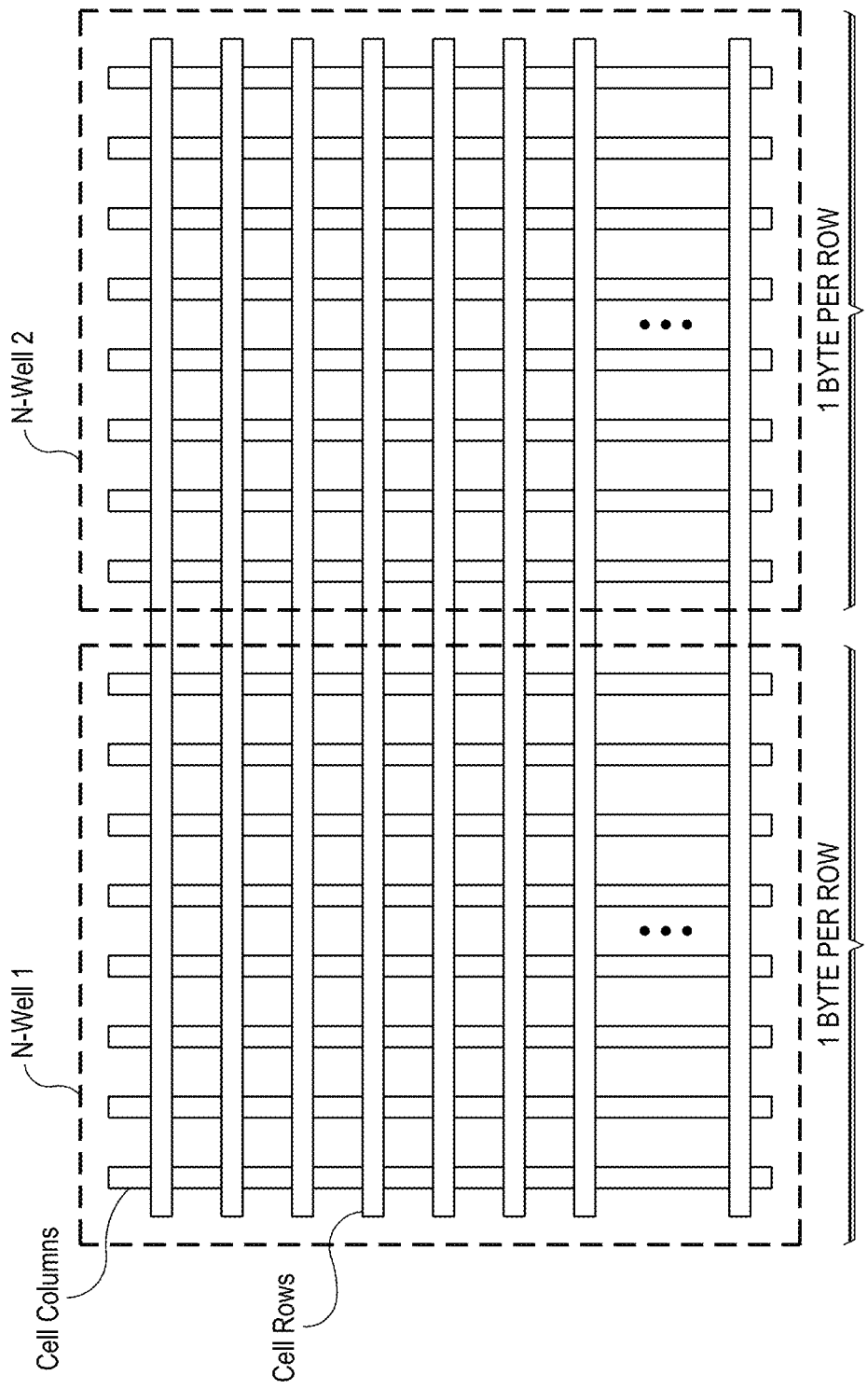
FIG. 2 shows an example conventional memory array architecture in which bytes are separated using implant wells.
Figure 3:
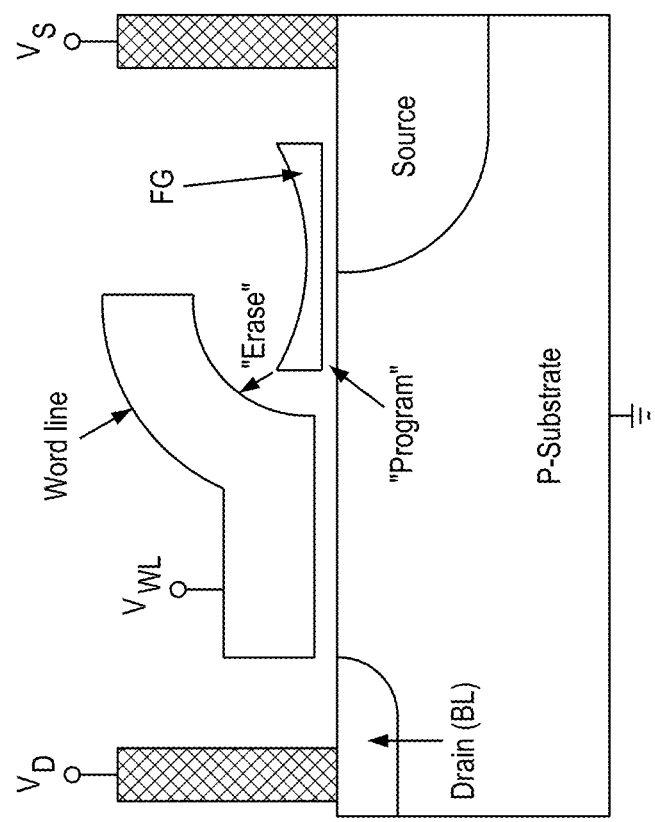
FIG. 3 shows an example of a conventional single-gate memory cell design, which is embodied in certain embedded SuperFlash® (ESF) memory cell designs.
Figure 4:
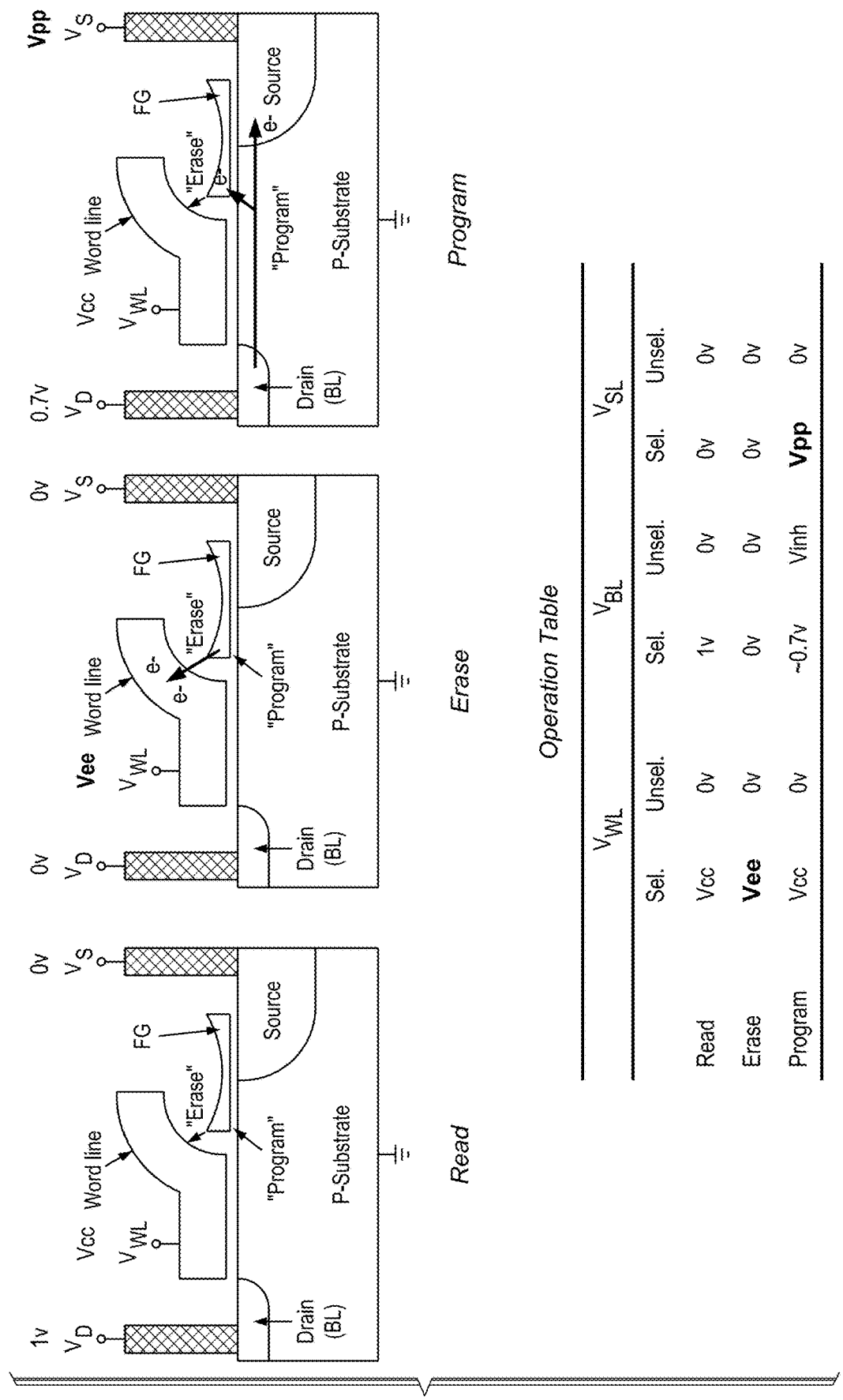
FIG. 4 shows three cross-section views of an example flash memory cell and an operational voltage table to illustrate read, erase, and program functions for the example memory cell.
Figure 5:
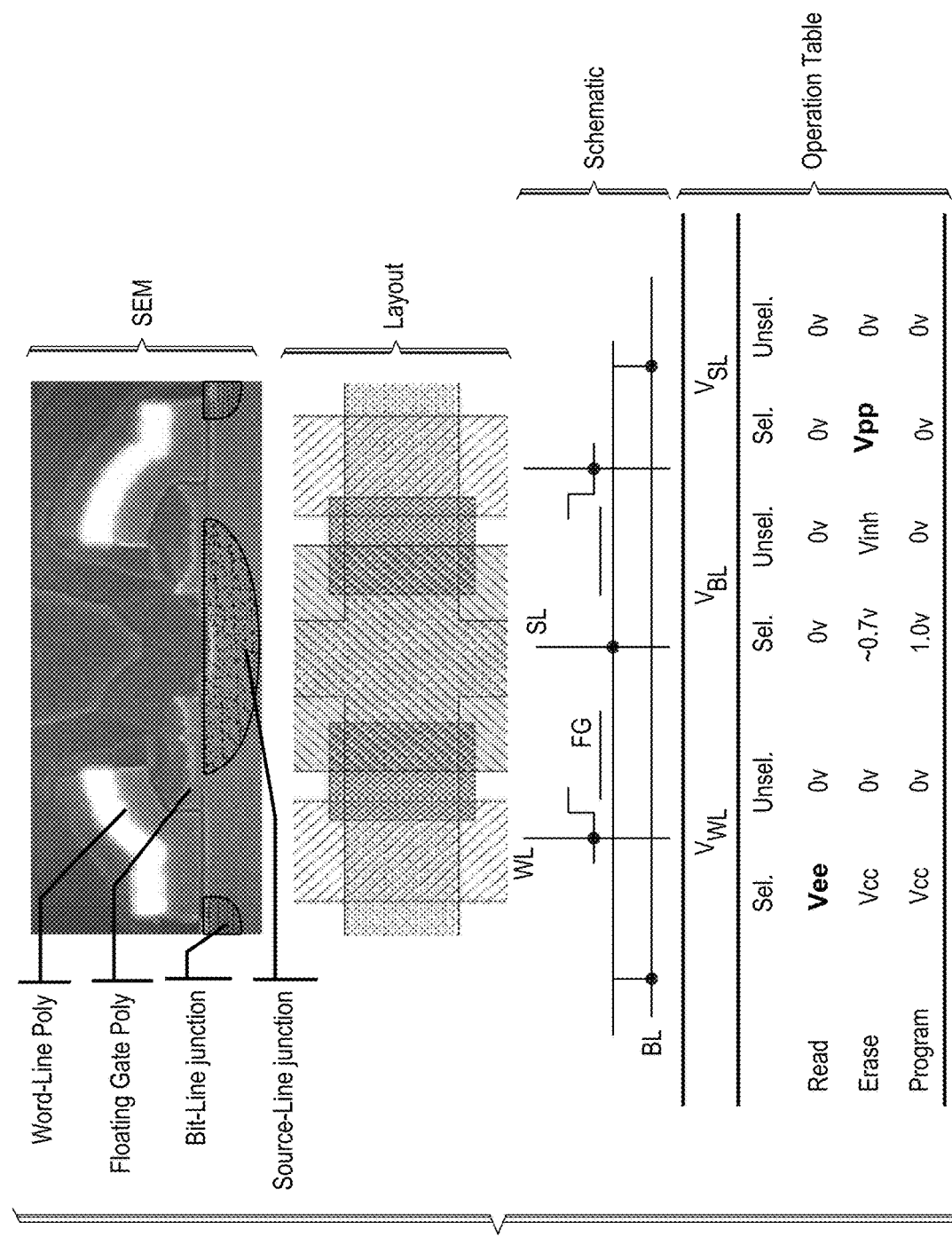
FIG. 5 shows details of an example dual-floating gate flash memory cell, including shows (a) a cross-section SEM view of the example memory cell, (b) an overhead layout view of the memory cell, (c) a circuit schematic of the memory cell, and (d) an example operational voltage table for the memory cell.

The concepts disclosed herein, including using a shared source line to address multiple bytes, may be applied to various types of memory cells, including SuperFlash ESF memory (discussed above) and other suitable types of cells. For example, the disclosed concepts may also be applied to any array with memory cells that utilize a common source between two floating gates and/or two select gates, such as SuperFlash memory cells and stacked gate memory cells (e.g., with poly 1 and poly 2 gates formed in a self-aligned stacked arrangement. for example. The disclosed concepts may also be applied to any suitable split-gate flash memory cells, including for example (a) split-gate cells using a shared erase gate, for example the memory cells disclosed in U.S. Pat. No. 6,747,310, in particular in FIGS. 2A-4E and corresponding portions of the specification, which disclosure is herein incorporated by reference, and (b) split-gate cells using a shared coupling gate, for example the memory cells disclosed in U.S. Pat. No. 8,711,363, in particular in FIG. 1 and corresponding portions of the specification, which disclosure is herein incorporated by reference.

The invention claimed is:

1. A memory array, comprising:
a plurality of memory cells arranged into a plurality of bytes, each byte including one or more memory cells;
a plurality of word lines, each connected to a single byte of the plurality of bytes; and
a shared source line connected to the plurality of bytes;
such that each byte in the plurality of bytes is addressable by one of the separate word lines and by the shared source line;
wherein the memory array is configured to perform a program operation on a selected byte of the plurality of bytes, in which (a) a common source line voltage is applied to each of the plurality of bytes, including the selected byte and at least one unelected byte, via the shared source line and (b) a common word line voltage is applied to the plurality of bytes, including the selected byte and the at least one unelected byte, via the plurality of word lines.

2. The memory array of claim 1, wherein each byte includes multiple memory cells, and wherein, for each respective byte, the memory array comprises a respective bit lines connected to each memory cell of the respective byte.

3. The memory array of claim 1, wherein the plurality of bytes is a subset of bytes in the memory array.

4. The memory array of claim 1, wherein the plurality of bytes includes 2, 4, 8, 16, 32, 64, or 128 bytes.

5. The memory array of claim 1, wherein the source line voltage and word line voltage on a second byte of the plurality of bytes corresponds with a row program disturb condition.

6. The memory array of claim 1, wherein:
the plurality of bytes includes at least a first byte and a second byte;
the first byte is connected to a first word line of the plurality of word lines;
the second byte is connected to a second word line of the plurality of word lines;
the first and second bytes are connected to the common source line;
the first byte is connected to at least one first bit line; and
the second byte is connected to at least one second bit line separate from the at least one first bit line.

7. The memory array of claim 6, further comprising drivers configured to, for a program operation on the first byte:
apply the common word line voltage on the first word line connected to the first byte and the second word line connected to the second byte;
apply a source line voltage on the shared source line connected to both the first and second bytes; and
apply an inhibit voltage on the at least one second bit line connected to the second byte.

8. The memory array of claim 1, wherein the plurality of memory cells comprise NOR flash memory cells.

9. The memory array of claim 8, wherein the plurality of split-gate memory cells comprise embedded SuperFlash® memory cells.

10. The memory array of claim 1, wherein the plurality of memory cells comprise a plurality of split-gate memory cells.

11. The memory array of claim 10, wherein the plurality of split-gate memory cells comprise split-gate cells having a shared erase gate or a shared coupling gate.

12. The memory array of claim 1, comprising a single source line driver for the shared source line, such that a total number of single source line drivers in the memory array is less than a total number of bytes in the memory array.

13. The memory array of claim 1, wherein the plurality of memory cells comprises a plurality of split-gate single transistor source side injection flash memory cells.

14. A memory device, comprising:
an memory array comprising a plurality of memory cells arranged into a plurality of bytes, a plurality of separate word lines, each word line connected to a single byte of the plurality of bytes;
a plurality of shared source lines, each shared source line connected to at least two of the plurality of bytes;
a plurality of word line drivers configured to apply voltages to the plurality of separate word lines; and
a plurality of source line drivers configured to apply voltages to the plurality of shared source lines;
such that each byte in the plurality of bytes is addressable by (a) one of the separate word lines connected to a respective word line driver and (b) one of the shared source lines connected to a respective source line driver;
wherein as a result of each shared source line being connected to at least two bytes, the number of shared source lines in the memory device is less than the number of word lines in the memory device, and the number of source line drivers in the memory device is less than the number of word drivers in the memory device; and
wherein for a program operation on a selected byte connected to a first shared source line (a) a common source line voltage is applied via the shared source line to each byte connected to the first shared source line, including the selected byte and at least one unelected byte and (b) a common word line voltage is applied via respective word lines to each byte connected to the first shared source line, including the selected byte and the at least one unelected byte.

15. The memory device of claim 14, wherein each shared source line is connected to 2, 4, 8, 16, 32, 64, or 128 bytes.

16. The memory device of claim 14, wherein the plurality of memory cells comprise NOR flash memory cells.

17. The memory device of claim 14, wherein the plurality of memory cells comprise split-gate memory cells.

18. The memory device of claim 14, wherein the plurality of memory cells comprise embedded SuperFlash® memory cells.

19. The memory device of claim 14, wherein the plurality of memory cells arranged into a plurality of bytes comprises a plurality of split-gate single transistor source side injection flash memory cells arranged into a plurality of bytes.

20. A method of operating a memory array including at least a first byte and a second byte, a first word line and at least one first bit line connected to the first byte, a second word line and at least one second bit line connected to the second byte, and a shared source line connected to both the first and second bytes, the method comprising:
performing a program operation on the first byte by:
applying a first word line voltage on the first word line connected to the first byte;
applying the first word line voltage on the second word line connected to the second byte;
applying respective data voltages on the at least one first bit line connected to the first byte;
applying a source line voltage on the shared source line connected to both the first and second bytes; and applying an inhibit voltage on the at least one second bit line connected to the second byte, the inhibit voltage reducing disturb effects on the second byte caused by the program operation on the first byte.

* * * * *